United States Patent
Rosselli et al.

(10) Patent No.: US 10,635,394 B2
(45) Date of Patent: Apr. 28, 2020

(54) BINARY-TO-GRAY CONVERSION CIRCUIT, RELATED FIFO MEMORY, INTEGRATED CIRCUIT AND METHOD

(71) Applicant: STMicroelectronics S.r.l., Agrate Brianza (IT)

(72) Inventors: Salvatore Marco Rosselli, Catania (IT); Giuseppe Guarnaccia, Augusta (IT)

(73) Assignee: STMicroelectronics S.r.l., Agrate Brianza (MB) (IT)

( * ) Notice: Subject to any disclaimer, the term of this patent is extended or adjusted under 35 U.S.C. 154(b) by 0 days.

(21) Appl. No.: 16/256,449

(22) Filed: Jan. 24, 2019

(65) Prior Publication Data

US 2019/0265947 A1 Aug. 29, 2019

(30) Foreign Application Priority Data

Feb. 23, 2018 (IT) .................. 102018000003008

(51) Int. Cl.
*G06F 5/14* (2006.01)
*G06F 13/42* (2006.01)
*G06F 5/06* (2006.01)
*G11C 7/22* (2006.01)
(Continued)

(52) U.S. Cl.
CPC ............ *G06F 5/14* (2013.01); *G06F 5/06* (2013.01); *G06F 13/4243* (2013.01); *G11C 7/222* (2013.01); *H03M 7/16* (2013.01); *G06F 2205/102* (2013.01); *G06F 2205/106* (2013.01); *G11C 7/1018* (2013.01)

(58) Field of Classification Search
CPC .......... G06F 5/14; G06F 5/06; G06F 13/4243; G06F 2205/106; G06F 2205/102; H03M 7/16; G11C 7/222; G11C 7/1018
See application file for complete search history.

(56) References Cited

U.S. PATENT DOCUMENTS

| | | |
|---|---|---|
| 6,337,893 B1 | 1/2002 | Pontius |
| 6,934,198 B1 | 8/2005 | Lowe et al. |
| 7,796,062 B1 | 9/2010 | Rangavajjhala et al. |

(Continued)

FOREIGN PATENT DOCUMENTS

EP 2362318 A1 8/2011

OTHER PUBLICATIONS

Wikipedia contributors, "Gray code", Wikipedia, the Free Encyclopedia, Retrieved Jun. 12, 2019 from https://en.wikipedia.org/w/index.php?title=Gray_code&oldid=826967133, 9 pages.

*Primary Examiner* — Gene N Auduong
(74) *Attorney, Agent, or Firm* — Slater Matsil, LLP

(57) ABSTRACT

A circuit and method for performing a Binary-to-Gray conversion are disclosed. A first binary signal represents a target value and a second binary signal is stored in a register. A set of binary candidate values are determined where the respective Gray equivalent of each binary candidate value has a Hamming distance of one from the Gray equivalent of the second binary value. One of the binary candidate values is selected as a function of the first binary signal and the second binary signal. The selected binary candidate value is provided at input to the register. An encoded signal is generated by determining the Gray encoded equivalent of the selected binary candidate value.

21 Claims, 6 Drawing Sheets

(51) Int. Cl.
*H03M 7/16* (2006.01)
*G11C 7/10* (2006.01)

(56) References Cited

U.S. PATENT DOCUMENTS

| | | |
|---|---|---|
| 10,048,893 B2 * | 8/2018 | Goikhman .......... G06F 13/4027 |
| 2008/0013386 A1 | 1/2008 | Condorelli et al. |
| 2016/0099031 A1 | 4/2016 | Guarnaccia et al. |
| 2016/0099032 A1 | 4/2016 | Rosselli et al. |

* cited by examiner

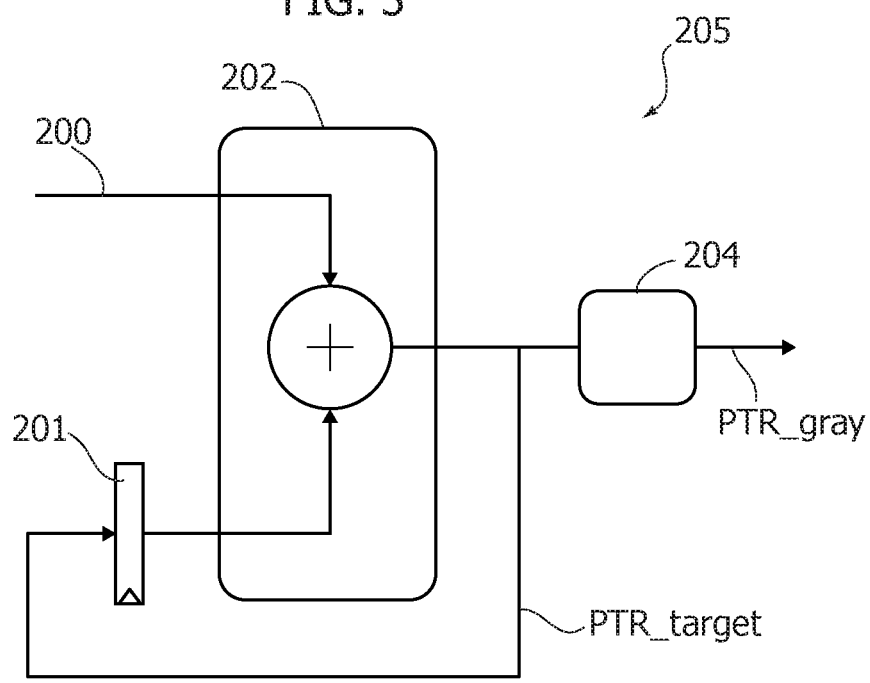

| | T₀ | T₁ | T₂ | T₃ | T₄ |
|---|---|---|---|---|---|
| CLK | | | | | |
| PTR_target | 4 | 13 | 13 | 13 | |
| WE | 9 | 0 | 0 | 0 | |
| PTR_gray | 0110 | 1110 | 1010 | 1011 | |

BINARY-TO-GRAY CONVERSION CIRCUIT, RELATED FIFO MEMORY, INTEGRATED CIRCUIT AND METHOD

CROSS-REFERENCE TO RELATED APPLICATIONS

This application claims the benefit of Italian Application No. 102018000003008, filed on Feb. 23, 2018, which application is hereby incorporated herein by reference.

TECHNICAL FIELD

The present invention relates generally to a binary-to-gray conversion circuit, and a related FIFO memory, integrated circuit and method.

BACKGROUND

A possible approach to facilitate data exchange in a system among components which are clocked at different frequencies is to include a First-In First-Out (FIFO) memory as described in, e.g., European patent document EP 2362318 A1.

Such a FIFO memory may be accessed via separate logical blocks for read/write operations, which may belong to separate clock domains. Specifically, operation of FIFO memories may involve writing to in response to a first clock domain and reading in response to second clock domain.

The FIFO memory circuit may comprise a memory area, e.g., a register bank implemented with a plurality of registers. Moreover, a FIFO memory comprises a write interface configured to generate a write pointer indicating an address/memory location in the memory area for a write operation and a read interface configured to generate a read pointer indicating an address/memory location in the memory area for a read operation. The FIFO memory may thus be coupled to a first digital circuit configured to provide data to the write interface for storing the data in the memory area and a second digital circuit configured to access the read interface for reading data from the memory area.

Generally, the number of memory locations is limited. Accordingly, the write interface should be able to determine that the memory area is not full and the read interface should be able to determine that the memory area is not empty. For this purpose, often control signals are generated by comparing the write and read pointers.

In this respect, signal consistency may be facilitated by using a synchronization circuit, associated to the FIFO, configured to provide synchronization between the write and read pointers. Moreover, often the write and read pointers are not exchanged as binary values, but the write and read pointers are converted from a binary encoding to a Gray encoding. Gray codes are well known in the art. For example, reference can be made to US Pat. App. Pub. 2008/0013386 A1 for the construction of Gray codes having a given number of bits, which is incorporated herein by reference for this purpose.

Accordingly, such synchronization involves, e.g., a Gray encoding operation of the binary encoded write pointer in the first clock domain (write clock signal) and a Gray decoding operation in the second clock domain (read clock signal) in order to obtain again the binary encoded write pointer. Similar operation may also be performed for the read pointer.

Specifically, such a Gray encoding ensures that only a single bit changes while the write and read pointers increase.

In fact, in a conventional FIFO memory a single memory location is written or read per clock cycle, e.g., in response to a write or read enable signal provided by the first or second digital circuit, respectively. For example, in this scheme, the write pointer can be increased only by one at the time at each write clock cycle, thereby resulting in a Gray encoded write pointer changing only by a single bit, i.e., the Hamming distance between two consecutive write pointers is always at most one, thereby reducing possible glitches during the transmission.

However, the write and/or read interfaces may support also a burst mode in which a plurality of memory locations may be written or read in a single clock cycle, thereby increasing the write or read pointer by a number of memory locations being potentially greater than one. However, such a jump of the binary encoded write pointer may result in errors during the synchronization, insofar as such an increment will result in a variation of the Gray encoded write pointer with respect to its previous value of a Hamming distance greater than one. Similar issues exist also for the read pointer.

SUMMARY

The description relates to techniques for generating Gray coded signals from binary coded signals. For example, such Gray coded signals may be used for synchronizing data through multiple clock domains. One or more embodiments may be applied to synchronization circuits comprising FIFO memories capable of burst writing.

One or more embodiments of the present description can provide solutions for generating a sequence of Gray encoded values as a function of a binary signal, wherein the final value corresponds to the Gray encoded value of the binary signal while the Hamming distance between the consecutive intermediate values of the Gray encoded values maintain a unitary Hamming distance, i.e., at most a single bit change occurs between two consecutive intermediate values.

For example, such a sequence of Gray encoded values may again be used in the synchronization of a write and/or read pointers of a FIFO memory.

In one or more embodiments that object can be achieved by means of a circuit having the features set forth in the claims that follow. One or more embodiments may relate to a corresponding device comprising such a circuit, e.g., a FIFO memory, and a related method.

As mentioned before, various embodiments of the present disclosure relate to a Binary-to-Gray conversion circuit.

In various embodiments, the Binary-to-Gray conversion circuit comprising an input for receiving a first binary signal.

In various embodiments, the Binary-to-Gray conversion circuit also comprises a register storing a second binary signal. A prediction circuit receives at input the second binary signal and provides at output a set of binary candidate values, wherein the respective Gray equivalent of each binary candidate value has a Hamming distance of one from the Gray equivalent of the second binary signal. Specifically, in various embodiments, the prediction circuit is configured to provide a number of binary candidate values corresponding to the number of bits of the first binary signal.

In various embodiments, an arbiter selects one of the binary candidate values as a function of the first binary signal and the second binary signal, wherein the selected binary candidate value is provided again to the register. For example, the arbiter may have associated a preprocessing circuit configured to select the binary candidate values of the set of binary candidate values, which are between the value of the second binary signal, representing a lower limit, and the value of the first binary signal, representing an upper limit or target value.

For example, the preprocessing circuit may comprise for each binary candidate value a respective Out-of-Range circuit, each configured to generate a respective mask signal indicating whether the respective binary candidate value is between/not between the lower and the upper limit. The arbiter may thus disregard the binary candidate values having a respective mask signal indicating that the respective binary candidate value is not between the lower and the upper limit. Additionally, the arbiter may also disregard the binary candidate values having a distance from the second binary signal being greater than a given maximum distance. In various embodiments, the arbiter may thus select a binary candidate value among the remaining binary candidate values. For example, the arbiter may select the binary candidate value having the greatest value.

In various embodiments, the selected binary candidate value is also provided to an encoder block configured to provide at output the Gray encoded equivalent of the selected binary candidate value.

In various embodiments, the prediction circuit is implemented with a combinational logic circuit. For example, as will be described in the following, the prediction circuit may comprise for each binary candidate value a respective sub-circuit. Specifically, in various embodiments, the sub-circuits have associated a circuit configured to provide at output a first signal corresponding to the second binary signal having the bits inverted. In various embodiments, each sub-circuit comprises a circuit configured to generate a second signal by selecting a given number of Most Significant Bits of the second binary signal, a circuit configured to generate a third signal by selecting a given number of Least Significant Bits of the first signal, and a circuit configured to generate the respective binary candidate value by combining the second signal and the third signal. Specifically, the number of Most Significant Bits and Least Significant Bits depends on the index of the binary candidate values to be provided by the respective sub-circuit.

For example, such a Binary-to-Gray conversion circuit may be used in a FIFO memory. For example, a FIFO memory usually comprises a memory area comprising a plurality of memory locations and a control circuit. Specifically, the control circuit comprises a write interface configured to generate a binary write pointer indicating a memory location for writing data to the memory area and a read interface configured to generate a binary read pointer indicating a memory location for reading data from the memory area.

In order to determine the full and/or empty status of the FIFO memory, the control circuit comprises also a synchronization circuit for exchanging the binary write pointer and/or binary read pointer between the write interface and the read interface. Specifically, usually such a synchronization circuit is configured to exchange Gray coded signals. Accordingly, in various embodiments, the FIFO memory comprises at least one Binary-to-Gray conversion circuit as described in the foregoing, wherein the Binary-to-Gray conversion circuit receives at input the binary write pointer or the binary read pointer, wherein the Gray encoded equivalent of the selected binary candidate values at the output of the Binary-to-Gray conversion circuit is provided to the synchronization circuit.

BRIEF DESCRIPTION OF THE DRAWINGS

One or more embodiments will now be described, by way of non-limiting example only, with reference to the figures, wherein:

FIG. 3 shows an exemplary circuit for generating a Gray encoded write or read pointer;

FIG. 4 shows a timing diagram of the operation of the circuit of FIG. 3;

DETAILED DESCRIPTION OF ILLUSTRATIVE EMBODIMENTS

Figure 1:
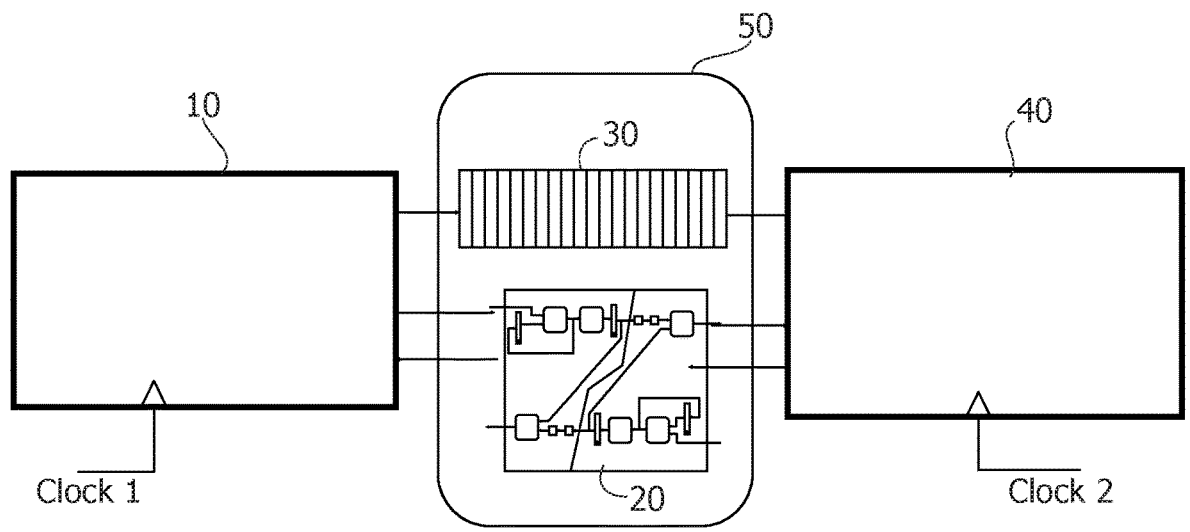
FIG. 1 shows an exemplary architecture of a FIFO memory.

In the following description, various specific details are given to provide a thorough understanding of various exemplary embodiments. The embodiments may be practiced without one or several specific details, or with other methods, components, materials, etc. In other instances, well-known structures, materials, and operations are not shown or described in detail to avoid obscuring various aspects of the embodiments.

Reference throughout this specification to "one embodiment" or "an embodiment" means that a particular feature, structure, or characteristic described in connection with the embodiment is included in at least one embodiment. Thus, the possible appearances of the phrases "in one embodiment" or "in an embodiment" in various places throughout this specification are not necessarily all referring to the same embodiment. Furthermore, particular features, structures, or characteristics may be combined in any suitable manner in one or more embodiments.

The headings provided herein are for convenience only, and therefore do not interpret the extent of protection or scope of the embodiments.

As described in the foregoing, in a system, such as a System on Chip (SoC), comprising multiple clock domains, metastability of signals is a general problem present whenever crossing clock domains, e.g., when data is transferred from a first digital circuit, operating at a first clock, to a second digital circuit, operating at a second clock, different from the first clock. Different clock signals may have different frequencies, e.g., as in an asynchronous system or they may have the same frequency but an uncorrelated relative phase difference, e.g., as in a mesochronous system.

For example, this applies to the write and read pointers described in the foregoing. To transfer a signal from a first clock domain to another, a state-of-the-art technique comprises passing the signal through a synchronization chain, e.g., a cascade of D-type flip-flops controlled via the second clock signal. Metastability occurs naturally when the input signal of the synchronization chain changes during the setup/hold time of the flip-flops.

A conventional approach to reduce the possibility of errors due to metastability is Gray encoding. Gray code may prevent invalid transient states ("glitches") from being captured when a signal crosses clock domains. Each bit of the signal is sampled non-deterministically for this clock domain transfer. So, for each bit, either the old value or the new value is propagated. Therefore, if more than one bit in the multi-bit signal is changing at the sampling point, a "glitch" binary value (neither new nor old) can be propagated. By guaranteeing only one bit can be changing, i.e. unitary Hamming distance between subsequent signal values is guaranteed, Gray code enables that the only possible sampled values are the new or old multi-bit values. Gray encoding together with brute force synchronization helps thus to reduce or even eliminate any glitches, because the output of any register remains stable.

The above synchronization problem will now be described again at the example of a FIFO memory.

Specifically, FIG. 1 shows an exemplary architecture of a FIFO memory 50 coupled to a first digital circuit (write logic block) 10 operating with a first clock signal Clock1 and a second digital circuit (read logic block) 40 operating with a second clock signal Clock2.

Specifically, the FIFO memory 50 comprises a memory area 30 comprising a plurality of memory locations, e.g., implemented with registers, and a control circuit 20 configured to manage a write pointer and a read pointer for write and read access to the memory locations of the memory area 30, respectively.

For example, the write logic block 10 may be capable to write data to one or more memory locations currently selected by the control circuit 20 via the write pointer at the frequency of the clock signal Clock1, and the read logic block 40 can read data from one or more memory locations currently selected by the control circuit 20 via the read pointer at the frequency of the clock signal Clock2.

In various embodiments the control circuit 20 may be configured to use a binary encoding for the write pointer and the read pointer used to select respective write and read memory locations, e.g., the binary sequence "100" corresponds to the decimal number 4.

In various embodiments the control circuit 20 may be configured to generate a full signal and an empty signal as a function of the write and read pointers.

For this purpose, the control circuit 20 may be configured to synchronize the write and/or read pointer through a Brute Force Synchronizer, e.g., a chain of registers.

Consistency of signals while crossing clock domains may be facilitated by construction via the control circuit 20 associated to the FIFO, configured to provide synchronization of Gray-encoded pointers. Gray encoding ensures only a single bit changes as address bus counts up or down. Thus, the write pointer can be increased only by one at the time at each write clock cycle, otherwise the advantage of the use of the Gray encoding may become irrelevant.

Figure 2:
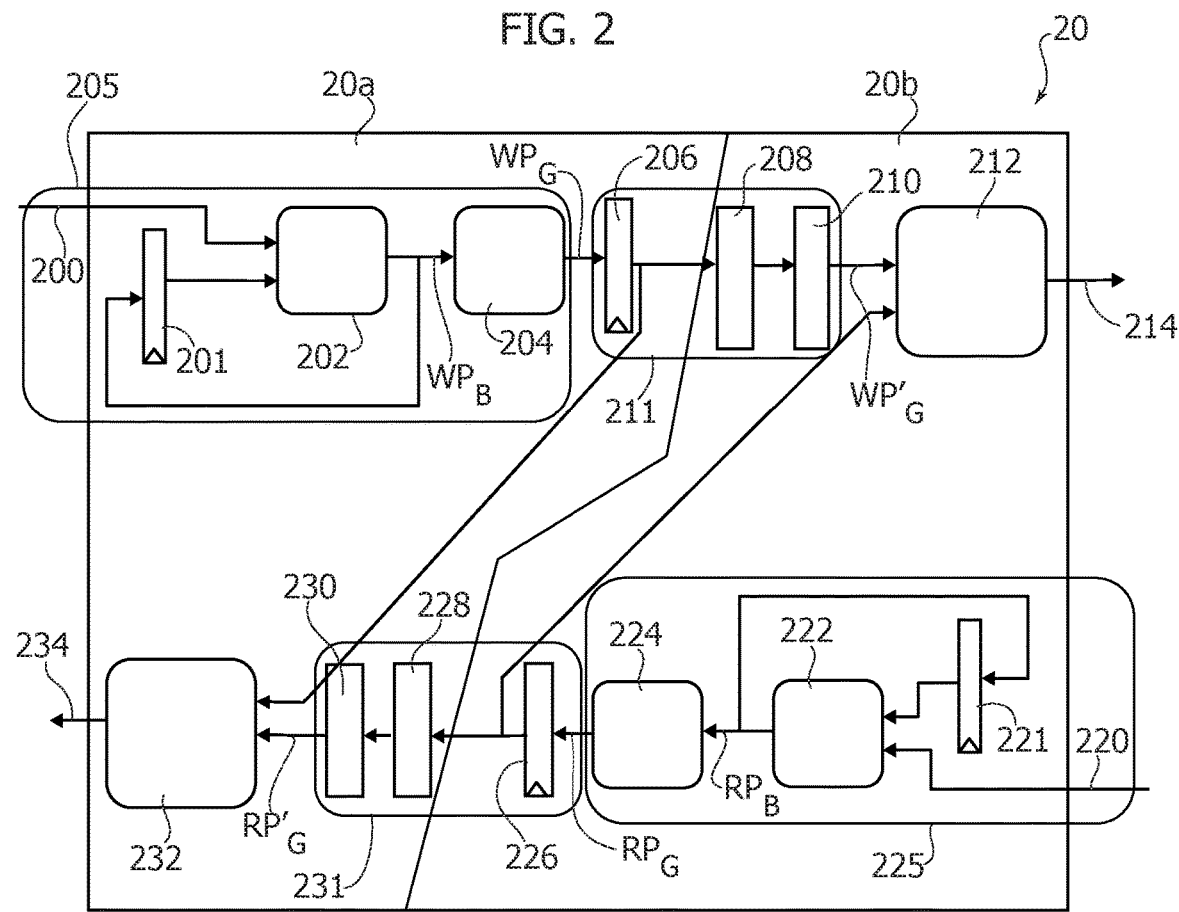
FIG. 2 shows an exemplary control circuit adapted to generate a write or read pointer in the FIFO memory of FIG. 1

For example, FIG. 2 shows a possible embodiment of the control circuit 20.

In the embodiment considered, the control circuit 20 comprises a first sub-circuit 20a operating at the clock frequency Clock1 provided by the write logic block 10 and a second sub-circuit 20b operating at the second clock frequency Clock2 provided by the read logic block 40.

As mentioned before the control circuit 20 is configured to generate a write pointer and a read pointer.

In the embodiment considered, the control circuit 20 comprises an accumulator comprising a binary adder 202 and a register 201. Specifically, the adder 202 receives at input the content of the register 201 and a signal 200. Accordingly, the adder 202 provides at output a signal corresponding to the sum of the content of the register 201 and the signal 200, which is written again to the register 201. In the embodiment considered, the signal at the output of the adder 202 may thus correspond to the write pointer with binary coding $WP_B$.

For example, when using a conventional FIFO memory the signal 200 may correspond to a write enable signal, whereby the write pointer $WP_B$ is incremented by one when the write enable signal is set to high and the write pointer $WP_B$ remains constant when the write enable signal is set to low. Specifically, the adder 202 and the register 201 form part of the sub-circuit 20a operating with the clock signal Clock1.

Conversely, when implementing a FIFO memory supporting a burst write mode, the signal 200 may correspond to the number of memory locations to be written in a single clock cycle.

Similarly, the sub-circuit 20b may comprise an accumulator implemented with a binary adder 222 and a register 221, wherein the adder provides at output a read pointer with binary coding $RP_B$ corresponding to the sum of the content of the register 221 and a signal 220, which may correspond to a read enable signal or indicate a number of memory locations to be read. Specifically, the adder 222 and the register 221 form part of the sub-circuit 20b operating with the clock signal Clock2.

In various embodiments, the control circuit 20 may also comprise a first circuit 232 configured to determine a FIFO full signal 234 and/or a second circuit 212 configured to determine a FIFO empty signal 214.

Generally, the circuit 232 is configured to generate the FIFO full signal 234 by comparing the write pointer with the read pointer. Similarly, the circuit 212 is configured to generate the FIFO empty signal 214 by comparing the write pointer with the read pointer.

Accordingly, in the embodiment considered, the control circuit 20 comprises circuitry for passing the write pointer to the clock domain 20b, and/or circuitry for passing the read point to the clock domain 20a.

Specifically, in various embodiments, this circuitry passes a Gray encoded version of the write and read pointer, respectively.

Specifically, in the embodiment considered, the binary write pointer $WP_B$ at the output of adder 202 is provided to a Binary-to-Gray conversion circuit 204, which thus provides at output a Gray coded write pointer $WP_G$.

In the embodiment considered, the output of the Binary-to-Gray conversion circuit 204 (i.e., the signal $WP_G$) is provided to a synchronization circuit 211.

For example, in one or more embodiments, the synchronization circuit 211 comprises a plurality of registers 206, 208 and 210. In one or more embodiments, at least one register (e.g., register 206) may be driven by the clock signal Clock1 and at least one register (e.g., registers 208 and 210) may be driven by the clock signal Clock2. Registers of the synchronization circuit 211 may be collectively called Brute Force Synchronizer (BFS). The last register 210 of the synchronization circuit 210 provides thus at output a delayed version of the Gray encoded write pointer $WP'_G$.

Similarly, the binary read pointer $RP_B$ at the output of adder 222 may be provided to a Binary-to-Gray conversion circuit 224, which thus provides at output a Gray encoded read pointer $RP_G$. The Gray encoded read pointer $RP_G$ may be provided to a synchronization circuit 231, which thus provides at output delayed version of the Gray coded read pointer $RP'_G$. Also in this case, the synchronization circuit 231 may be implemented with a plurality of registers 226, 228 and 230, wherein at least one register (e.g., register 226) may be driven by the clock signal Clock2 and at least one register (e.g., registers 228 and 230) may be driven by the clock signal Clock1.

Accordingly, in various embodiments the first circuit 232 may determine the FIFO full signal 234, e.g., by converting the delayed Gray coded read pointer $RP'_G$ back to binary coding and compare the respective binary pointer with the binary encoded write pointer $WP_B$, or comparing the delayed Gray coded read pointer $RP'_G$ with the Gray coded write pointer $WP_G$.

Similarly, the second circuit 212 may determine the FIFO empty signal 214, e.g., by converting the delayed Gray coded write pointer $WP'_G$ back to binary coding and compare the respective binary pointer with the binary encoded read pointer $RP_B$, or comparing the delayed Gray coded write pointer $WP'_G$ with the Gray coded read pointer $RP_G$.

Thus, generally, the circuit 212 and/or the circuit 232 may comprise a Gray-to-Binary decoder. Specifically, in the embodiment considered, the control circuit 20 controls the write pointer increment by a sub-circuit 205 comprising an input node coupled to the signal 200, the register 201, the adder 202 and the Binary-to-Gray conversion circuit 204. Similarly, the control circuit 20 controls the read pointer increment within a sub-circuit 225, comprising an input node coupled to the signal 220, the register 221, the adder 222 and the Binary-to-Gray conversion circuit 224. In various embodiments, the sub-circuit 205 and the sub-circuit 225 may have the same circuit structure.

In this respect, U.S. Pat. No. 9,311,975 provides a solution for implementing the sub-circuits 205 and/or 225. Specifically, this document describes a solution, wherein the FIFO memory 50 may be configured to allow a non-consecutive jump in the read/write pointer to a new memory location. For example, the write pointer may be the result of a data burst from the write logic block 10. Essentially, this document proposes a FIFO memory 50 configured to determine a plurality of address jump candidates (which may be alternatively called jump candidates or candidates) for the write and/or read pointer from a current memory location position. Next, the FIFO memory 50 may be configured to select an address jump candidate from the plurality thereof.

An embodiment of sub-circuit 205 of the control circuit 20 without specific data-burst design is shown in FIG. 3 to illustrate the concept that using Gray encoding with data-burst enabled does not guarantee that the distance between two consecutive (clock cycles) Gray encoded pointers maintains unitary Hamming distance from its previous value.

In this exemplary embodiment, the binary adder 201 consists of an adder coupled to the signal 200 and to the register 201. Specifically, the adder 202 receives at input the content of the register 201 and a signal 200. Accordingly, the adder 202 provides at output a signal corresponding to the sum of the content of the register and the signal 200, which is written again to the register 201. In the embodiment considered, the signal at the output of the adder 202 may thus correspond to the write pointer with binary coding $WP_B$. The same may also apply, to the read pointer with binary coding $RP_B$. The value resulting from the sum of these two values, will thus be indicated generically as target pointer/signal PTR_target in the following.

In the embodiment considered, the target pointer PTR_target is then provided to the Binary-to-Gray conversion circuit 204. In the embodiment considered, the signal at the output of the output of the Binary-to-Gray conversion circuit 204 corresponds thus to the Gray encoded equivalent of the input value PTR_target and will be indicated in the following as signal PTR_gray.

FIG. 4 shows a temporal diagram of the content of the aforementioned signals in an exemplary embodiment according to FIG. 3.

For example, at the clock cycle indicated as T0 the value of the signal PTR_target is PTR_target(T0)=$(4)_{10}$, where $_{10}$ indicated the decimal representation of the value of the pointer. For example, in binary coding, the decimal value four corresponds to the bit sequence "0100". The value of the signal PTR_gray is the Gray encoded equivalent of the value of the signal PTR_target during the clock cycle T0, e.g. by using a bit sequence comprising four bits, the signal PTR_gray may be "0010"=$(4)_{10}$.

In the example considered, during the same clock cycle the value WE of the signal 200 is e.g. WE(T0)=$(9)_{10}$. Thus, at the subsequent clock cycle, indicated as T1, the value PTR_target stored in the register 401 changes and is updated with the value of the sum of signals PTR_target and WE at T0 e.g. PTR_target(T1)=PTR_target(T0)+WE(T0)=$(13)_{10}$. Thus, when using the circuit of FIG. 3, the Gray equivalent of PTR_target at T1 would be e.g. PTR_gray(T1)="1011"= $(13)_0$, which is at Hamming distance above unity from the previous value. Thus, in the subsequent synchronization chain the Hamming distance from consecutive values of the PTR_gray signal is more than unity, leading to possible errors as more than one-bit change has to be passed across the clock domains.

Figures 5, 6:
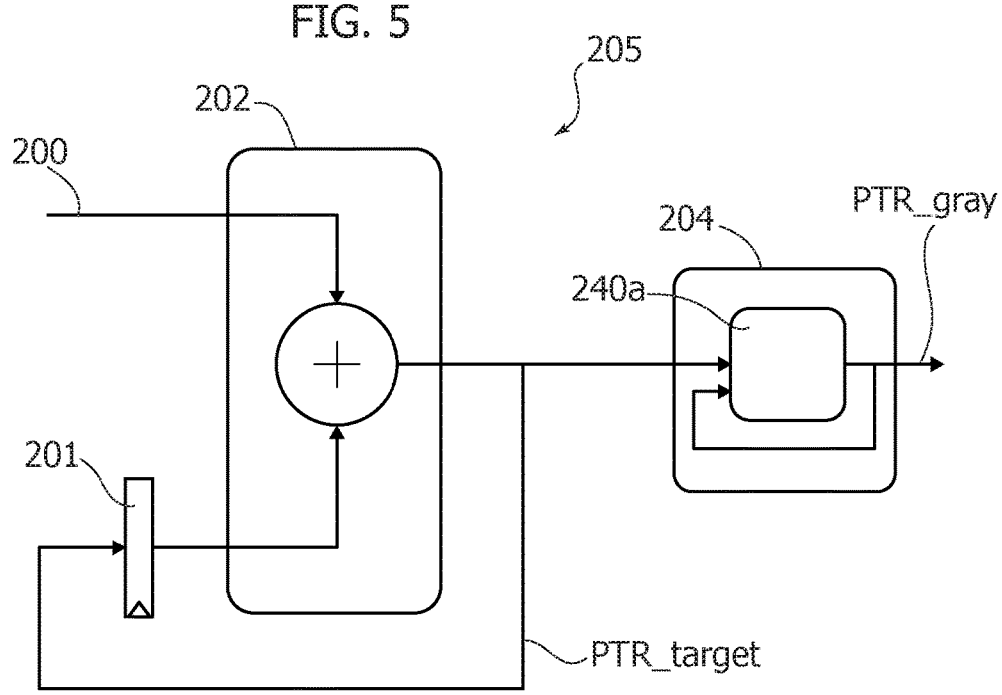
FIG. 5 shows a further circuit for generating a Gray encoded write or read pointer.
FIG. 6 shows a timing diagram of the operation of the circuit of FIG. 5.

An exemplary embodiment of the sub-circuit 205 of the control circuit 20 in line with U.S. Pat. No. 9,311,975 is shown in FIG. 5.

In this exemplary embodiment, the binary adder 201 consists again of an adder coupled to the signal 200 and to the register 201. Specifically, the adder 202 receives at input the content of the register 201 and the signal 200. Accordingly, the adder 202 provides at output the signal PTR_target corresponding to the sum of the content of the register 201 and the signal 200, which is written again at the next clock cycle to the register 201.

The result PTR_target is passed to a circuit 204 performing a Binary-to-Gray conversion 204. However, this circuit 204 does not implement a straight Binary-to-Gray converter 204, but a more complex conversion is performed. For this purpose, the signal PTR_target is provided to a Binary-to-Gray conversion circuit 240a. The circuit 240a comprises an input node for receiving a binary encoded signal, such as the signal PTR_target, and output node providing a Gray encoded signal PTR_gray. As will be described in the following, in a given clock cycle the Gray encoded output signal PTR_gray does not necessarily correspond to the Gray encoded value of the binary encoded input signal PTR_target. Accordingly, in various embodiments, the input node may be coupled to the output of the adder circuit 202.

In the embodiment considered, the Binary-to-Gray conversion circuit 240a comprises moreover a further input node configured to receive the Gray encoded output signal PTR_gray, thereby implementing a feedback loop of the output signal PTR_gray.

Specifically, according to U.S. Pat. No. 9,311,975, the Binary-to-Gray conversion circuit 240a generates all Gray values/candidates having a unitary Hamming distance from the current signal PTR_gray. Next, the circuit 240a determines the binary equivalents of these Gray values/candidates and selects the Gray value, whose binary equivalent is the closest to the signal PTR_target. These operations are repeated for one or more clock cycles, until the binary equivalent of the output signal PTR_gray reaches the value of the signal PTR_target. The result is sequence of Gray encoded values PTR_gray, wherein the last values PTR_gray corresponds to the Gray equivalent of binary signal PTR_target.

FIG. 6 shows a temporal diagram of data transfer in an embodiment according to FIG. 5.

For example, at the clock cycle indicated as T0 the value of the PTR_target signal is again PTR_target(T0)=$(4)_{10}$. The value of the signal PTR_gray is the Gray encoded equivalent of the value of the PTR_target signal during T0 clock cycle, e.g. PTR_gray="0110"=$(4)_{10}$. During the same clock cycle the value WE of the signal 200 is again WE(T0)=$(9)_{10}$.

At the subsequent clock cycle, indicated as T1, the value of the signal PTR_target stored in the register 201 changes and is updated with the value of the sum of PTR_target and WE at T0 e.g. PTR_target(T1)=PTR_target(T0)+WE(T0)= $(13)_{10}$.

Accordingly, the value of the signal PTR_target provided to the Binary-to-Gray conversion circuit 240a changes and is now $(13)_{10}$.

Specifically, in the embodiment considered, the Binary-to-Gray conversion circuit 2400a generates the Gray values/candidates having a Hamming distance of one from the current signal PTR_gray, such as the signals "1110", "0010", "0100", "0111" for the example considered. Moreover, the Binary-to-Gray conversion circuit 240a determines the binary equivalents of these Gray values/candidates, such as "1110"=$(11)_{10}$, "0010"=$(3)_{10}$, "0100"=$(7)_{10}$, "0111"=$(5)_{10}$ for the example considered. Next, the Binary-to-Gray conversion circuit 240a selects the Gray value, whose binary equivalent has the smallest positive distance to the signal PTR_target (i.e. the binary equivalent, which is the closest to and less than the signal PTR_target), i.e. "1110"=$(11)_{10}$ for the example considered. Accordingly, in the example considered, the circuit 240a provides now at output PTR_gray(T1)="1110"=$(11)_{10}$.

These operations are repeated for one or more clock cycles, until the binary equivalent of the output signal PTR_gray reaches the value of the signal PTR_target. The result is sequence of Gray encoded values PTR_gray ("1110"=$(11)_{10}$, "1010"=$(12)_{10}$, "1011"=$(13)_{10}$) wherein the last values PTR_gray corresponds to the Gray equivalent of the binary signal PTR_target.

Thus, this implementation does guarantee consistency of the signals in the subsequent synchronization chain.

However, the inventors have observed that this solution is slow (e.g. form the Gray-to-binary decoding operations performed for each candidate value) and expensive in terms of area occupancy of components.

Figure 7:
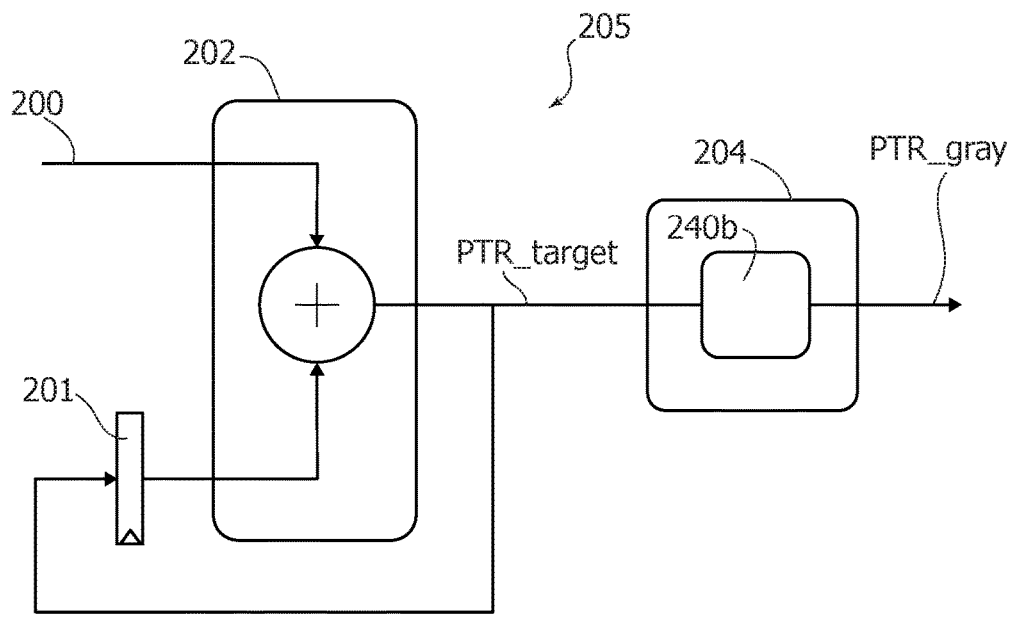
FIG. 7 shows an embodiment of a circuit for generating a Gray encoded write or read pointer.

One or more embodiments of sub-circuit 205 of the control circuit 20 according to the present description is shown in FIG. 7. For example, also this circuit may be used in a FIFO memory supporting a data-burst mode. Specifically, also this circuit ensures that the Hamming distance between two consecutive Gray values PTR_gray at the output of the sub-circuit 205 remains unitary.

Also in this exemplary embodiment, the binary adder 202 includes an adder coupled to the signal 200 and to the register 201 as described in the foregoing. The signal PTR_target at the output of the adder 202 is passed to a circuit performing a Binary-to-Gray conversion 204. Specifically, in the embodiment considered, the circuit 204 comprises a Binary-to-Gray conversion circuit 240b, which receives at input the binary encoded signal PTR_target and provides at output a sequence of Gray encoded signals PTR_gray, wherein again the last Gray encoded value corresponds to the Gray equivalent of the signal PTR_target.

Figure 8:
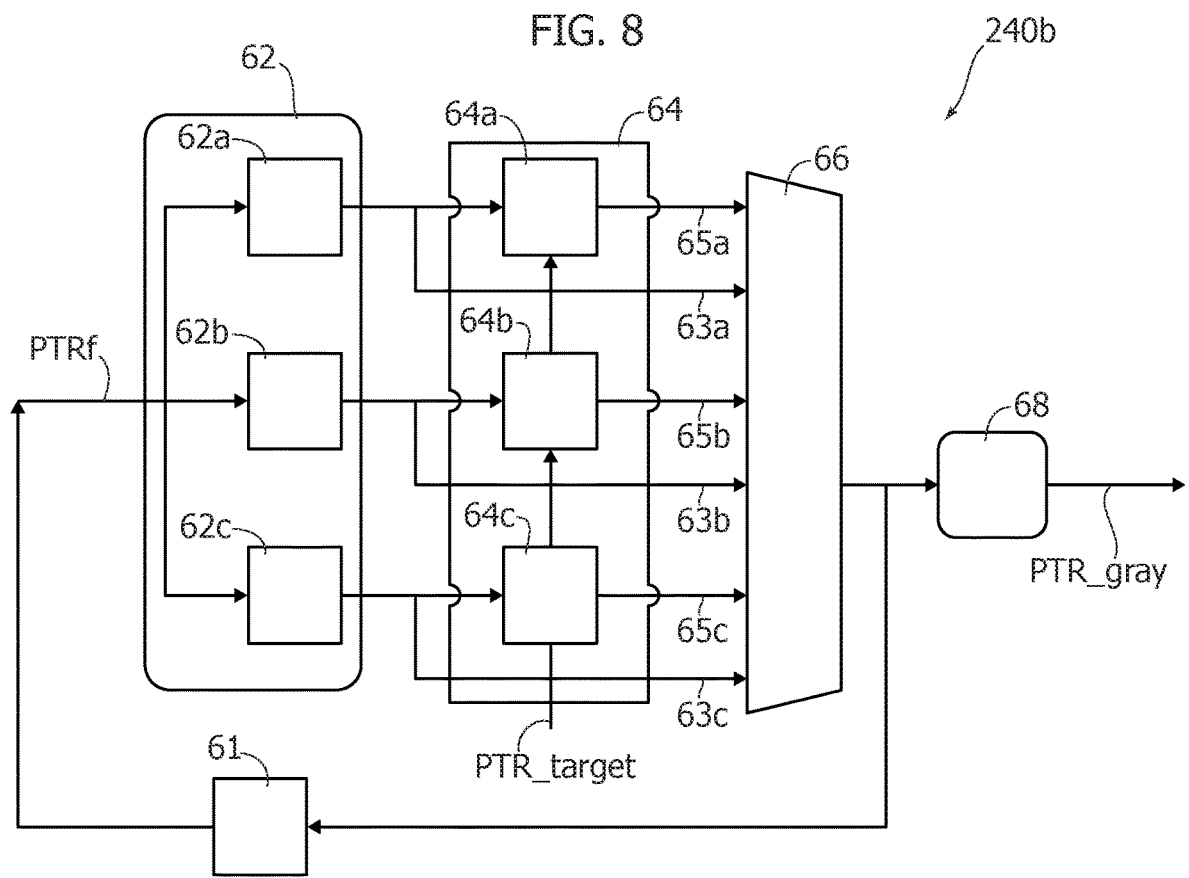
FIGS. 8, 9, 10 and 11 show details of the operation of the circuit of FIG. 7.

FIG. 8 shows an exemplary hardware embodiment of sub-circuit 205 of the control circuit 20.

In one or more embodiments, circuit 240b comprises an input node for receiving the binary signal PTR_target and an output node for providing the signal PTR_gray.

In the embodiment considered, the circuit 240b comprises also a register 61. Specifically, in the embodiment considered, the register 61 is configured to store the binary equivalent value PTRf of the signal PTR_gray.

Specifically, in the embodiment considered, the output signal PTRf of the register 61 is provided to a prediction circuit 62. Specifically, the prediction circuit 62 is configured to receive at input the signal PTRf and provide at output a set of binary candidate values 63a-63c, wherein the respective Gray equivalent of each binary candidate value has a Hamming distance of one from the Gray equivalent of the signal PTRf. For example, assuming that the value PTRf has the binary value $(4)_{10}$ (corresponding to the Gray value "0110"), the prediction circuit 62 may provide at output the binary values $(11)_{10}$ (corresponding to the Gray value "1110"), $(3)_{10}$ (corresponding to the Gray value "0010"), $(7)_{10}$ (corresponding to the Gray value "0100"), and $(5)_{10}$ (corresponding to the Gray value "0111").

In various embodiments, the number of binary candidate values corresponds to the number of bits of the signal PTRf.

In general, the possible binary candidate values 63a-63c for each value of the signal PTRf may be pre-calculated. Accordingly, the prediction circuit 62 may be implemented with a Look-Up Table having stored for each value of the signal PTRf the respective set of binary candidate values, wherein the respective Gray equivalent of each binary candidate values has a Hamming distance of one from the Gray equivalent of the respective signal PTRf.

Conversely, FIG. 8 shows an embodiment, wherein the prediction circuit 62 comprises a plurality of prediction circuits 62a-62c. The number of prediction circuits 62a-62c corresponds to the number of bits of the signal PTRf, wherein each prediction circuit 62a-62c provides at output a respective binary candidate value 63a-63c.

Specifically, in various embodiments, the prediction circuits 62a-62c are implemented with combinational logic circuits configured to calculate the respective binary candidate value in real time as will be described in the following.

In one or more embodiments, the binary candidate values 63a-64c are provided to an arbiter 66, which is configured to select one of the binary candidate values 63a-63c. The signal at the output of the arbiter 66 corresponds thus to the next binary signal PTRf and is thus fed at input to the register 61. Moreover, the signal at the output of the arbiter 66 is provided to a binary-to-Gray encoder block 68. Specifically, in various embodiments, the encoder block 68 is a combinational logic circuit providing at output the Gray encoded equivalent of the signal PTRf received at input.

For example, in order to select the "best" binary candidate value for a given signal PTR_target, the arbiter may have associated a preprocessing circuit 64. For example, in various embodiments, the preprocessing circuit 64 is configured to select only the binary candidate values 63a-63c being between the current value of the signal PTRf, representing a lower limit, and the signal PTR_target, representing an upper limit or target value.

For example, in the embodiment considered, each binary candidate value 63a-63c may be provided to a respective Out-of-Range block 64a-64c, each configured to generate a respective mask signal 65a-65c, indicating whether the respective binary candidate value is between the lower and upper limit.

Accordingly, in the embodiment considered, the arbiter 66 may only take into account the binary candidate values 63a-63c having a respective mask signal indicating that the binary candidate value 63a-63c is between the lower and upper limit, i.e., binary candidate value 63a-63c being out of range are not taken into account.

In various embodiments, the preprocessing circuit 64/Out-of-Range blocks 64a-64c may also limit (in addition to the lower and upper limit) the selection to the binary candidate values 63a-63c having a maximum distance from the current value of the signal PTRf. For example, this maximum distance may be programmable, thereby permitting to set a maximum allowed jump value.

Accordingly, once received the sub-set of binary candidate values 63a-63c, as indicated e.g. by the mask signals 65a-65c (e.g., the respective mask signal may be set when the respective binary candidate values 63a-63c is selected and between the permitted limits), the arbiter 66 may select one of the values of the sub-set of binary candidate values 63a-63c.

For example, the arbiter 66 may select the greatest value of the sub-set of binary candidate values 63a-63c. For example, the prediction circuit 62 may provide at output a sequence of binary candidate values 63a-63c in increasing (or alternatively decreasing) order. Accordingly, the arbiter 66 may select the value of the sub-set of binary candidate values 63a-63c being the last (or alternatively first) value having a masking signal indicating that the respective binary candidate values 63a-63c is between the permitted limit.

In various embodiments, the arbiter 66 may be implemented with a combinational logic circuit, thereby selecting a binary candidate value within a single clock cycle.

In the following will now be described a possible implementation of the prediction circuit 62.

Generally, any binary encoded value V may be represented by a given number of bits k.

By using a Gray encoding for such a binary encoded value V, the respective Gray encoded value $V_G$ has usually also k bits. Due to the fact, that the candidate values should have a Hamming distance of one from this Gray encoded value $V_G$, k possible Gray encoded candidate values exist, wherein the i-th Gray encoded candidate has the i-th bit of the Gray encoded value $V_G$ inverted.

Instead of performing these operations on Gray encoded values, various embodiments of the present disclosure operate directly with binary values in order to estimate k binary encoded candidate values $C_1 \ldots C_k$.

Specifically, in various embodiments, the i-th (with i=1 . . . k) binary encoded candidate value may be computed by solving the equation:

$$C_i(V) = [(2^k - 1 - V) \bmod 2^i] + 2^i \cdot \mathrm{floor}\frac{V}{2^i} \quad (1)$$

where the operation "mod" corresponds to the modulo operation, and the operation "floor" receives at input a real number and provides at output the greatest integer number that is less than or equal to the input number.

The above equation may be determined empirically, and essentially results from the properties of the Gray code, which may be generated by "mirroring" the codes of the previous bits (see, e.g., the description of US Pat. App. Pub. 2008/0013386 A1 for the construction of Gary codes).

Figure 9:
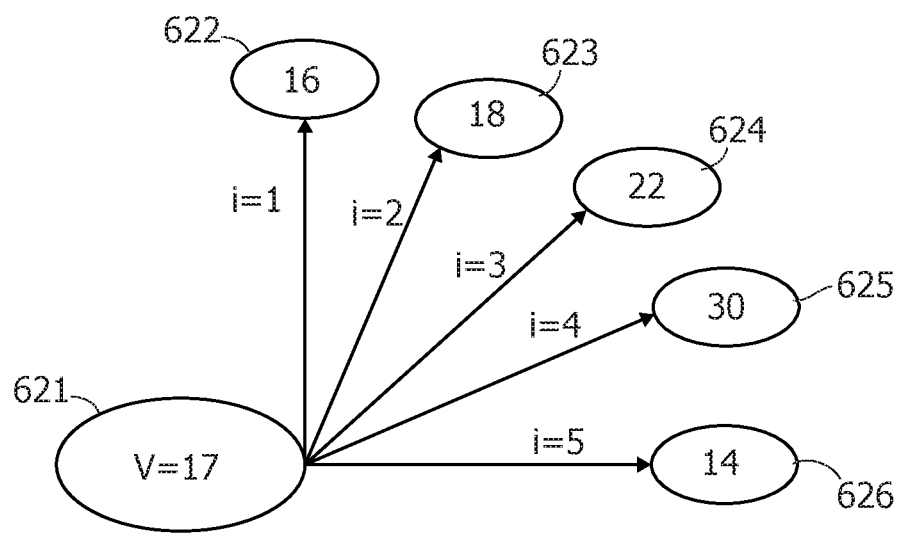

An exemplary conceptual diagram of how the prediction circuit 62 calculates the respective binary candidate values in real time according to equation (1) is shown in FIG. 9.

Specifically, in the example considered, the value V indicated as 621 in FIG. 9 has a value corresponding to the decimal number V=17. In the example considered, the number of bits used to represent the decimal number V in binary encoding is e.g. k=5.

In this example, the value of the signal V may be then processed in the combinatorial logic of the prediction circuit 62 providing a set of k=5 binary candidate values 622-626, calculated according to the formula (1). Specifically, in various embodiments, the prediction circuit 62 determines a plurality of jump candidates 622-626, one i-th candidate per each i-th bit of the k bits representing the binary equivalent of the decimal number V.

In the considered operational example, the binary candidate values 622-626 computed with equation (1) correspond, e.g., respectively to the decimal values 16, 18, 22, 30, 14.

In one or more exemplary embodiments, the set of values $C_1 \ldots C_k$ may be obtained through combinational logic circuits.

Figure 10:
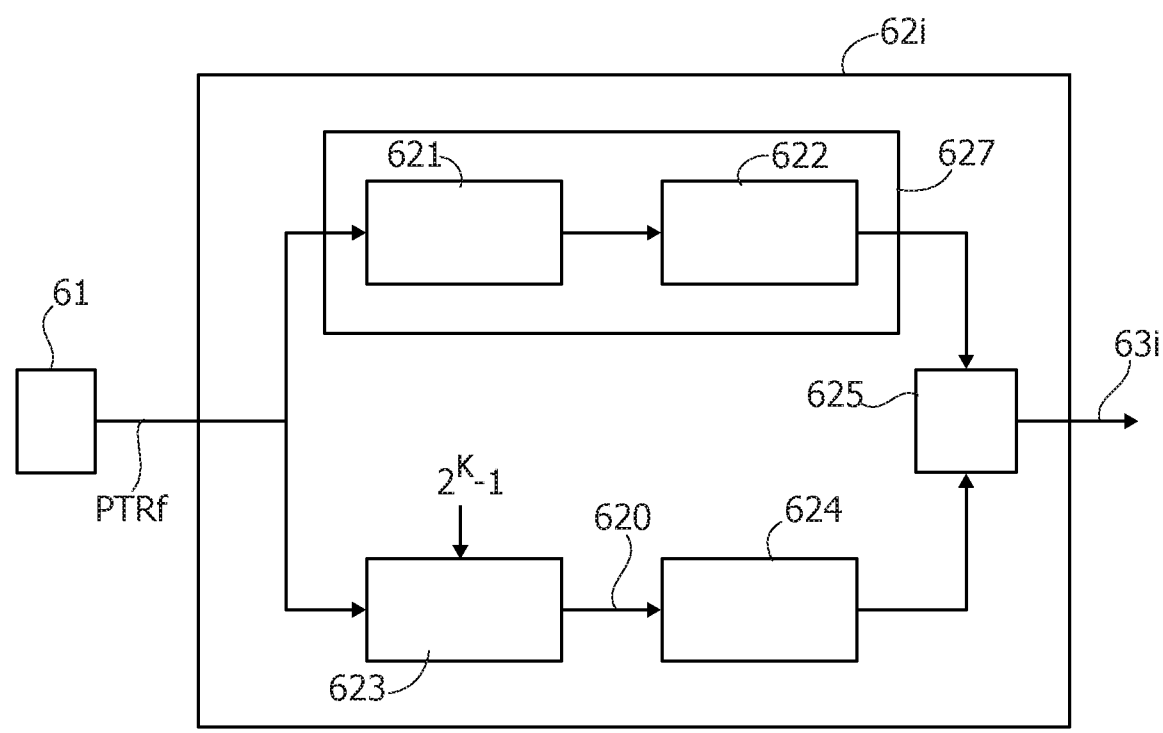

FIG. 10 shows an exemplary hardware embodiment 62i of the i-th prediction circuit 62a-62c providing thus at output the i-th binary candidate value 63i.

Thus, in this exemplary embodiment, the circuit 62i receives at input the signal PTRf value from the register 61 and provides at output the i-th binary candidate value 63i, wherein the Gray equivalent of the i-th binary candidate value has a Hamming distance of one from the Gray equivalent of the signal PTRf.

Specifically, the circuit 62i implements thus equation (1) for a given i.

Specifically, the inventors have observed that the term "floor(V/$2^i$)" may be implemented with a right shift operation. Conversely, the multiplication with $2^i$ may be implemented with a left shift operation.

This is also shown in FIG. 10, wherein the circuit 62i comprises a right logical shift 621 and a left logical shift 622. Specifically, in the considered exemplary embodiment, the right logical shift block 621 receives at input the signal PTRf from the pointer block 61 and calculates the value of the floor function of the ratio between V and the i-th power of 2 for a given value i. The output of the right logical shift block 621 is provided to the left logical shift block 622 which thus calculates the product of the i-th power of two and the value of the floor function of the ratio between V and the i-th power of 2.

Generally, insofar as the value i is fixed for a given circuit 62i, the shift operations may be hardwired. For example, instead of explicitly implementing the right shift and left shift operations, the circuits 621 and 622 may be combined in a circuit 627 configured to simply set the i Least Significant Bits (LSB) of the signal PTRf to "0," thereby essentially maintaining only the (k–i) Most Significant Bits (MSB) of the signal PTRf.

In the embodiment considered, the circuit 62i comprises moreover a binary subtractor circuit 623 configured to calculate the difference between the term ($2^k$–1) and the value of V— indicated as output value 620 in the figure— where k is again the number of bits used to represent V.

For example, in a hardware implementation the binary subtractor circuit 623 may be implemented with a binary added circuit. Specifically, a binary subtraction of two terms A and B may be implemented at a hardware level with a binary addition of (A+NOT(B)+1). Accordingly, a binary adder circuit 623 may receive at input the signal PTRf and provide at output the results of the binary addition of ($2^k$+NOT(PTRf)), wherein the logic operation NOT corresponds to a logic inversion of each bit of the signal PTRf and the term $2^k$ may be pre-calculated and fixed at hardware level.

However, a binary addition with the term $2^k$ indeed does not change the result of the operation, and accordingly, the circuit 623 may provide at output simply NOT(PTRf).

Generally, the circuit 623 does not consider the parameter i, and accordingly the circuit 623 may be common to all predication circuits 62a-62c, i.e., the circuit 623 may not be present within the circuit 62i as the value 620 is the same for all prediction circuits.

The output value 620 of the circuit 623 may be passed as input to a circuit 624 configured to calculate the modulo operation mod $2^i$.

For example, in various embodiments, the circuit 624 is implemented with a least significant bit (LSB) slicer configured to maintaining only the i Least Significant Bits (LSB) of the signal 620, i.e. the (k−i) Most Significant Bits (MSB) of the signal 620 are set to "0".

In the embodiment considered, the signals provided by the circuits 621/622 and 624 are then provided to a binary adder 625, yielding the value of the $i^{th}$ binary candidate value 63i.

Specifically, the circuit 627 provides a signal with the i Least Significant Bits set to "0" and the circuit 624 provides a signal with the (k−i) Most Significant Bits (MSB) set to "0". Accordingly, the adder circuit 625 may also simply generate a signal by selecting the (k−i) Most Significant Bits (MSB) of the signal provided by the circuit 627, and selecting the i Least Significant Bits of the signal provided by the circuit 624.

Figure 11:
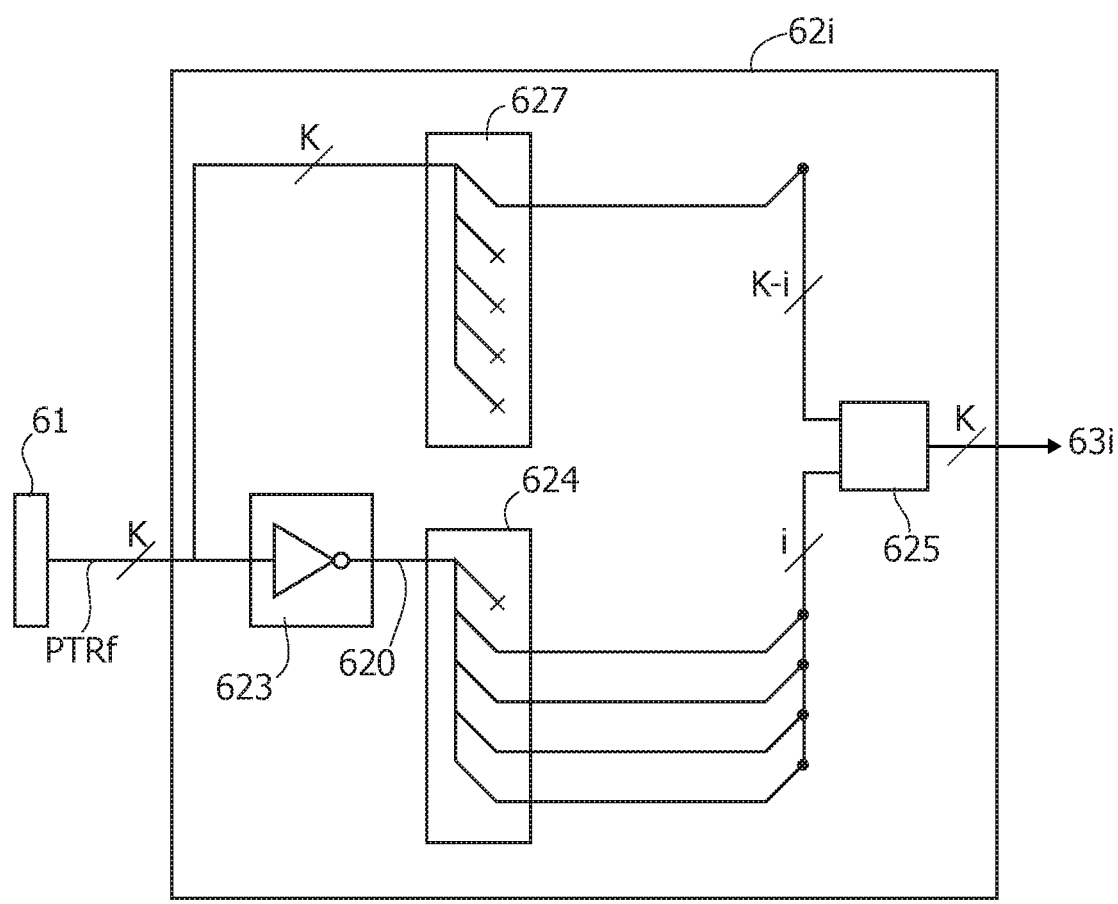

FIG. 11 shows an embodiment of an exemplary hardware implementation 62i of the i-th prediction circuit 62a-62c implementing equation (1) in the case where i can be considered a hardwired constant for the i-th instance.

In this exemplary embodiment, similarly to what described in the previous paragraphs, the circuit 62i receives at input the signal PTRf value from the register 61 and provides at output the i-th binary candidate value 63i, wherein the Gray equivalent of the i-th binary candidate value has a Hamming distance of one from the Gray equivalent of the signal PTRf.

The shift circuit 627 receives the k-bits of the PTRf signal, while the output of circuit 627 is provided as input to the binary adder 625. Specifically, circuit 627 propagates only the (k−i) Most Significant Bits (MSB) of the signal PTRf, possibly setting the i Least Significant Bits (LSB) of the signal PTRf to "0". For example, in the case of k=5 and i=4 the shift circuit 627 may provide at output a signal consisting of a single bit having the value of the MSB of PTRf.

The circuit 623 may be implemented with an inverter (or NOT logic gate), receiving at input the PTRf signal and providing at output a signal 620 whose bits are set to the opposite logic-level with respect to the input bits.

The output value 620 of the circuit 623, again, may be passed as input to a circuit 624 configured to calculate the modulo operation mod $2^i$. For example, in various embodiments, the circuit 624 receives the k-bits of signal 620, while the i bits at output of circuit 624 are provided as input to the binary adder 625.

Specifically, circuit 624 propagates only the i Least Significant Bits (LSB) of the signal 620 and the (k−i) Most Significant Bits (MSB) of the signal 620 may possibly be set to "0". For example, in the case of k=5 and i=4 the circuit 624 may provide at output a signal consisting of 4 bits having the value of the last four significant bits of PTRf.

In the embodiment considered, again, the signals provided by the circuits 627 and 624 are then provided to a circuit 625, yielding k bits representing the value of the i-th binary candidate value 63i by combining the signals from the circuits 624 and 627, e.g. by using the (k−i) Most Significant Bits provided by the circuit 627 and the i Least Significant Bits (LSB) provided by the circuit 624.

Therefore, using the circuit shown in FIG. 11 to implement the operations of the circuit shown in FIG. 10 will provide the i-th binary candidate value 63i corresponding to any of the binary candidate values 63a-63c.

Thus, by using the circuit shown in FIG. 10 in the prediction circuit 62 of FIG. 8, the prediction circuit 62 will provide at output k binary candidate values and the arbiter 66 will select one of the k binary candidate values 63a-63c as described in the foregoing. Thus, the arbiter provides at output a binary value, which is fed both to the register 61 and the binary-to-Gray encoder 68.

For example, as described with respect to FIG. 7 in the context of a FIFO memory, the signal PTR_target may correspond to the binary value write or read pointer. Thus, in this case, the circuit 240b provides at output a sequence of Gray encoded values PTR_gray (with Hamming distance one between consecutive Gray values), wherein the last Gray value corresponds to the Gray encoded version of the signal PTR_target.

Thus, in the context of a FIFO memory as shown in FIG. 2, the circuit shown in FIG. 7 may be used in combination with a synchronizer to transfer the write and/or read pointer to another clock domain.

The previously described circuits are thus particularly useful for FIFO memories supporting burst mode write and/or read operations, wherein a plurality of memory locations are written/read during one clock cycle. Generally, while the signal PTR_gray (corresponding to $WP_G$ or $RP_G$) does not necessarily correspond to the value of the binary write/read pointer $WP_B$ or $RP_B$ (corresponding to PTR_target), this does not represent a problem insofar as the sequence of Gray encoded values only increases until the respective binary write/read pointer is reached. For example, at most the signal FULL remains set even though the read interface has already read data or the signal EMPTY remains set even though the write interface has already written data, while still errors during the synchronization are avoided.

Thus, similarly to a conventional FIFO memory with write/read operations, the solution ensures signal consistency during the synchronization. Moreover, compared to the known solutions, area savings and a more compact implementation are possible. Specifically, various embodiments are based on the recognition that is also possible to directly determine binary pointer candidates, which can be exploited in a simple, improved hardware implementation. Thus, various embodiments may present a reduced area occupancy of circuitry by reducing the number of components, while addressing various issues discussed in the foregoing.

Generally, the circuit discussed in the foregoing may also be used in other arrangements where a conversion between a binary value being subject to "jumps" has to be converted into a respective Gray encoded value. For example, sometimes digital buses in electronic systems are used to convey quantities that can only increase or decrease, for example the output of a counter which is then passed between clock domains or to a digital-to-analog converter. Similarly, issues may exist for transmitting sensor signals, wherein signal consistency is more relevant than the latency of the transmission of the data. Thus, generally, the solution may also be used in other transmission systems, wherein Gray codes are used.

Without prejudice to the basic principles, the implementation details and the embodiments may vary, even appreciably, with respect to what has been described herein by way of non-limiting example only, without departing from the extent of protection.

What is claimed is:

1. A binary-to-gray conversion circuit, comprising:
   an input configured to receive a first binary signal;
   a register configured to store a second binary signal;
   a prediction circuit configured to receive the second binary signal and to provide a set of binary candidate values, wherein a respective Gray equivalent of each binary candidate value has a Hamming distance of one from a Gray equivalent of the second binary signal;
   an arbiter configured to select one of the binary candidate values as a function of the first binary signal and the second binary signal, wherein the selected binary candidate value is provided to the register; and
   an encoder block configured to receive the selected binary candidate value and output a Gray encoded equivalent of the selected binary candidate value.

2. The circuit according to claim 1, wherein the first binary signal, the second binary signal and the Gray encoded equivalent of the selected binary candidate value each have a given number k of bits, and the prediction circuit is configured to provide k binary candidate values.

3. The circuit according to claim 2, wherein the prediction circuit comprises k sub-circuits, each configured to provide at output an i-th binary candidate value, with i=1 . . . k.

4. The circuit according to claim 3, wherein the prediction circuit comprises a first circuit configured to receive the second binary signal and to provide a first signal by computing the difference between $(2^k-1)$ and the value of the second binary signal.

5. The circuit according to claim 4, wherein each the sub-circuit comprises:
   an input configured to receive the second binary signal;
   a second circuit configured to generate a second signal by selecting the (k−i) most significant bits of the second binary signal;
   a third circuit configured generate a third signal by selecting the i least significant bits of the first signal; and
   a fourth circuit configured to generate the respective binary candidate value by combining the second signal and the third signal.

6. The circuit according to claim 3, wherein the prediction circuit comprises a first circuit configured to receive the second binary signal and to provide a first signal by inverting the bits of the second binary signal.

7. The circuit according to claim 6, wherein each the sub-circuit comprises:
   an input configured to receive the second binary signal;
   a second circuit configured to generate a second signal by selecting the (k−i) most significant bits of the second binary signal;
   a third circuit configured generate a third signal by selecting the i least significant bits of the first signal; and
   a fourth circuit configured to generate the respective binary candidate value by combining the second signal and the third signal.

8. The circuit according to claim 1, wherein the arbiter is associated with a preprocessing circuit configured to select the binary candidate values of the set of binary candidate values that are between the value of the second binary signal and the value of the first binary signal, the value of the second binary signal representing a lower limit and the value of the first binary signal representing an upper limit or target value.

9. The circuit according to claim 8, wherein the preprocessing circuit comprises, for each binary candidate value, a respective out-of-range circuit, each configured to generate a respective mask signal indicating whether the respective binary candidate value is between the lower and the upper limit.

10. The circuit according to claim 9, wherein the arbiter is configured to disregard binary candidate values having a respective mask signal indicating that the respective binary candidate value is not between the lower and the upper limit.

11. The circuit according to claim 9, wherein the arbiter is configured to disregard the binary candidate values having a distance from the second binary signal that is greater than a given maximum distance.

12. The circuit according to claim 1, wherein the arbiter is configured to select the binary candidate value having the greatest value.

13. The circuit according to claim 1, wherein the arbiter is implemented with a combinational logic circuit.

14. A FIFO memory comprising:
   a memory area comprising a plurality of memory locations;
   a write interface configured to generate a binary write pointer indicating a memory location for writing data to the memory area;
   a read interface configured to generate a binary read pointer indicating a memory location for reading data from the memory area;
   a synchronization circuit configured to exchange the binary write pointer or the binary read pointer between the write interface and the read interface, wherein the synchronization circuit is configured to exchange Gray coded signals; and
   a binary-to-gray conversion circuit configured to receive the binary write pointer or the binary read pointer, wherein a Gray encoded equivalent of a binary candidate value determined by the Binary-to-Gray conversion circuit is provided to the synchronization circuit.

15. The FIFO memory according to claim 14, wherein the binary-to-gray conversion circuit comprises:
   a register configured to store a second binary signal;
   a prediction circuit configured to receive the second binary signal and to provide a set of binary candidate values, wherein a respective Gray equivalent of each binary candidate value has a Hamming distance of one from a Gray equivalent of the second binary signal;
   an arbiter configured to select one of the binary candidate values as a function of a first binary signal and the second binary signal, wherein the first binary signal is the binary write pointer or the binary read pointer and wherein the selected binary candidate value is provided to the register; and
   an encoder block configured to receive the selected binary candidate value and output a Gray encoded equivalent of the selected binary candidate value.

16. A method of performing a Binary-to-Gray conversion, the method comprising:
   receiving a first binary signal representing a target value;
   storing a second binary signal in a register;
   determining a set of binary candidate values, wherein the Gray equivalent of each respective binary candidate value has a Hamming distance of one from the Gray equivalent of the second binary value;

selecting one of the binary candidate values as a function of the first binary signal and the second binary signal, wherein the selected binary candidate value is provided at input to the register; and generating an encoded signal by determining the Gray encoded equivalent of the selected binary candidate value.

17. The method according to claim 16, wherein the first binary signal, the second binary signal and the Gray encoded equivalent of the selected binary candidate value each have a given number k of bits, and the set of binary candidate values has the k binary candidate values.

18. The method according to claim 16, wherein selecting one of the binary candidate values comprises selecting the binary candidate values of the set of binary candidate values that are between the value of the second binary signal and the value of the first binary signal, the value of the second binary signal representing a lower limit and the value of the first binary signal representing an upper limit or target value.

19. The method according to claim 18, further comprising, for each binary candidate value generating a respective mask signal indicating whether the respective binary candidate value is between the lower and the upper limit.

20. The method according to claim 19, further comprising disregarding binary candidate values having a respective mask signal indicating that the respective binary candidate value is not between the lower and the upper limit.

21. The method according to claim 19, further comprising disregarding the binary candidate values having a distance from the second binary signal that is greater than a given maximum distance.

* * * * *